United States Patent
Cantarini et al.

(10) Patent No.: US 6,472,254 B2
(45) Date of Patent: Oct. 29, 2002

(54) INTEGRATED PHOTOVOLTAIC SWITCH WITH INTEGRATED POWER DEVICE INCLUDING ETCHING BACKSIDE OF SUBSTRATE

(75) Inventors: William F. Cantarini, Redondo Beach; Steven C. Lizotte, Long Beach, both of CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/746,321

(22) Filed: Dec. 21, 2000

(65) Prior Publication Data

US 2001/0013627 A1 Aug. 16, 2001

Related U.S. Application Data

(62) Division of application No. 09/032,495, filed on Feb. 27, 1998.
(60) Provisional application No. 60/039,487, filed on Feb. 28, 1997.

(51) Int. Cl.[7] .................... H01L 21/332; H01L 21/336; H01L 21/76; H01L 21/30; H01L 21/46
(52) U.S. Cl. ................ 438/138; 438/270; 438/295; 438/404; 438/430; 438/459; 438/977
(58) Field of Search ............... 438/270, 430, 438/459, 928, 361, 435, 268, 437, 295, 404, 977, 138

(56) References Cited

U.S. PATENT DOCUMENTS

| | | | |
|---|---|---|---|
| 3,969,746 A | * 7/1976 | Kendall et al. | |
| 4,454,647 A | * 6/1984 | Joy et al. | |
| 4,745,081 A | * 5/1988 | Beyer et al. | |
| 5,091,330 A | 2/1992 | Cambou et al. | 437/62 |
| 5,204,282 A | 4/1993 | Tsuruta et al. | 437/62 |
| 5,240,867 A | * 8/1993 | Suzuki et al. | |
| 5,362,663 A | * 11/1994 | Bronner et al. | |
| 5,461,253 A | 10/1995 | Tsuruta et al. | 257/501 |
| 5,521,115 A | * 5/1996 | Park et al. | |
| 5,549,762 A | * 8/1996 | Cantarini | |
| 5,911,109 A | * 6/1999 | Razouk et al. | |

* cited by examiner

Primary Examiner—John F. Niebling
Assistant Examiner—Ron Pompey
(74) Attorney, Agent, or Firm—Ostrolenk, Faber, Gerb & Soffen, LLP

(57) ABSTRACT

N+ or P+ diffusions are formed in a lightly doped P type or N type starting wafer. Individual planar and spaced cells or tubs are then formed by etching an array of intersecting trenches between the P+ (or N+) diffusions. The trenches extend through the thin device layer to a predefined depth and are filled with a dielectric and with polysilicon to dielectrically insulate each of the tubs. At least one diffusion of each cell is connected to a diffusion of an adjacent cell to connect each of a predetermined number of the cells. The N+ or (P+) diffusions may be each enclosed by a ring shaped P+ or N+ contact diffusion. An MOS-gated device may be integrated into the same chip and may be a lateral or vertical MOSFET or a lateral or vertical IGBT.

17 Claims, 6 Drawing Sheets

INTEGRATED PHOTOVOLTAIC SWITCH WITH INTEGRATED POWER DEVICE INCLUDING ETCHING BACKSIDE OF SUBSTRATE

RELATED APPLICATIONS

This is a division of application Ser. No. 09/032,495, filed Feb. 27, 1998.

This application claims the priority of Provisional Application Serial No. 60/039,487, filed Feb. 28, 1997.

BACKGROUND OF THE INVENTION

This invention relates to semiconductor devices and more specifically, relates to a novel structure for such a device in which an array of planar cells are formed in a single silicon wafer and are dielectrically isolated from one another and in which one or more power devices can be integrated into the same chip as the planar cells.

It is often desirable to utilize a semiconductor device formed of a large number of cells. Photovoltaic generators (PVGs), for example, are well known and are commonly used for producing a control signal for a solid state relay. Such devices employ an LED which is energized by input terminals to irradiate the photosensitive surface of a spaced and insulated photovoltaic device. The output of the photovoltaic device may serve as the input to a switching device, such as a MOS-gated device, typically a power MOSFET or IGBT, which has load terminals which are switched "on" in response to the energization of the LED. The input and output terminals of the relay are isolated by the gap between the LED and the photovoltaic device. Commonly, the photovoltaic device consists of a large number of series-connected photovoltaic cells in order to produce a voltage sufficiently high to turn on the power switching device. Such devices are well known and are sold under the name "PVI" (photovoltaic isolator) by the International Rectifier Corporation of El Segundo, Calif., the assignee of the present invention.

The plural cell photogenerator can be made in many different ways. One known generator employs a stack or pile of photovoltaic cells as shown in U.S. Pat. Nos. 4,755,697 and 4,996,577, both to Daniel M. Kinzer. Other devices employ a planar array of cells which are junction isolated from one another and are connected in series at their surfaces. Still other devices are known in which individual cells disposed over the surface of a silicon chip are junction-isolated from one another or may be dielectrically isolated, as shown in U.S. Pat. Nos. 4,227,098 and 4,390,790. The prior art devices, however, have the drawback of being expensive to manufacture as well as having low manufacturing yields.

Alternatively, a planar array of photovoltaic generating cells are formed in a dielectrically bonded silicon wafer. A relatively thick "handle" wafer is oxide bonded to, as well as insulated from, a thin device wafer in which the junctions are formed, as shown in U.S. Pat. No. 5,549,762 to the present applicant. This device, however, requires a relatively expensive starting wafer.

It is therefore desirable to produce a photovoltaic generator that can be formed of a large number of insulated cells which can be connected in series to produce a turn-on signal for a power MOS-gated device but which is easily manufactured and integrated with the MOS-gated device using existing reliable processing equipment and techniques.

It is also desirable to produce other devices that can be formed of a large number of insulated cells which can be connected but which are easily manufactured and integrated with other devices.

BRIEF DESCRIPTION OF THE INVENTION

The present invention provides a novel device structure which includes a trench structure that is used to dielectrically isolate the respective cells of a multiple cell semiconductor device formed in a single wafer.

One or more N+ or P+ diffusions may be first formed in a lightly doped P or N type starting wafer. Alternatively, these diffusions can be formed after the trench processing is completed. Individual planar and spaced cells or tubs are then formed by etching an array of intersecting trenches which surround the diffusions. The trenches extend to a predefined depth and are filled with a dielectric and with polysilicon to dielectrically insulate each of, the cells. The diffusions of the various cells are connected to one or more diffusions of an adjacent cell to connect a predetermined number of the cells in series or in parallel.

The back side of the silicon is then ground off at least to the level of the bottom of the trenches, and an insulating oxide may be deposited on the back surface. A beam support may be used to insure that the trenched, ground wafer holds together.

In accordance with the present invention, dielectrically isolated, planar photovoltaic generating cells may be formed in a single wafer and, furthermore, may be integrated with one or more power devices in the same wafer.

A plurality of N+ (or P+) diffusions are formed in a lightly doped P type (or N type) starting wafer and are each enclosed by a ring shaped P+ (or N+) contact diffusion. Note that these diffusions can be made at the end of the process. Individual planar and spaced cells or tubs are then formed by etching an array of intersecting trenches between the P+ (or N+) contact diffusions. The trenches extend to a predefined depth and are then filled with a dielectric and with polysilicon. The substrate is then thinned to dielectrically insulate each of the tubs. The N+ top contact of each cell is connected to the P+ contact of an adjacent cell to connect each of a predetermined number of the cells in series.

An MOS-gated device may be integrated into the same chip as the photovoltaic generator structure in a trenched or an untrenched area of the wafer. The MOS-gated device, which may a lateral or vertical MOSFET or a lateral or vertical IGBT, is formed prior to the grinding of the back side of the wafer and may be formed prior to or subsequent to the formation of the photovoltaic generator cells or may be formed by some processing steps that are common with those of the photovoltaic generator cells.

The upper surface of the device is then exposed to light, such as the radiation output of a spaced LED, to produce output voltages from each of the cells. These outputs, which are connected in series, produce a signal which can control the switching of the MOS-gated device.

In accordance with a further aspect of the invention, significantly, other devices can be integrated into other dielectrically isolated cells of the wafer. For example, MOS-gated devices such as BJTS, MOSFETs, IGBTs, GTDs and the like can be formed in other isolated cells of the common wafer. Contact circuits can also be integrated in other isolated wells. The devices integrated in other wells can be lateral conduction devices, or even vertical conduction devices in which the cells containing vertical conduction devices will also contain a bottom contact. Significantly, the entire wafer can be used with all cells containing various circuit components to be interconnected to form a particular circuit.

Other features and advantages of the present invention will become apparent from the following description of the invention which refers to the accompanying drawings.

BRIEF DESCRIPTION OF THE DRAWINGS

The invention will now be described in greater detail in the following detail description with reference to the drawings in which.

DETAILED DESCRIPTION OF DRAWINGS

Figure 1:
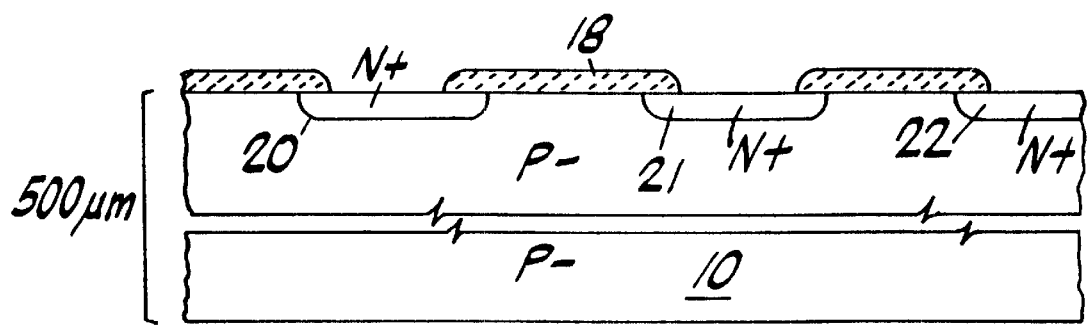
FIG. 1 shows a cross-section view of a portion of a device wafer following the diffusion of spaced, shallow N+ regions. Note that this step can be carried out after the step of FIG. 5.

Referring first to FIG. 1, there is shown a cross-section view of a portion of a silicon wafer substrate 10. An implant mask layer, which is typically silicon dioxide is grown atop the front surface of the wafer. Then, using a suitable photolithography technique, a conventional photoresist layer is applied to the top surface of the oxide layer and is patterned to form an array of rectangular or other shaped openings therein. The exposed portions of the oxide is then etched away, and the photoresist is stripped. N− type dopants, such as phosphorous or arsenic, are then implanted into the silicon through the openings in the oxide. The implant is next driven in to form shallow N+ diffusions 20, 21 and 22.

The oxide layer 18 is then removed, and another masking oxide layer 30 is grown atop the front surface of wafer 10. Alternatively, the first oxide layer 18 is removed prior to the drive-in of N+ diffusions 20 to 22, and the second oxide layer 30 is grown concurrent with the drive in of the N+ diffusions.

Figure 2:
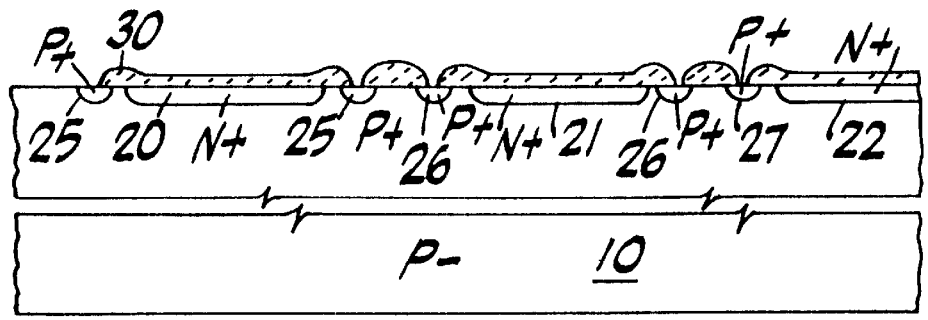
FIG. 2 shows the wafer of FIG. 1 following the diffusion of shallow P+ contact regions.

A photoresist layer is then deposited atop oxide layer 30 and then patterned to define openings for contact diffusions which are typically ring shaped. The exposed portions of the oxide are then etched, the photoresist is removed and a shallow boron does is implanted into the exposed silicon surface areas to form P+ contact rings 125, 26 and 27, shown in FIG. 2. Alternatively, a central P+ collecting finger that extends from the P+ rings 25, 26 and 27 can also be disposed at the center of each N+ diffusion. Following the implant step, there is a drive-in of the implant. The oxide layer 30 may be removed either before or after the drive-in step.

It should be noted that the implant energies and doses as well as the drive-in times and temperatures, can be determined based on the desired dopant distributions using methods known in the art.

Figure 3:
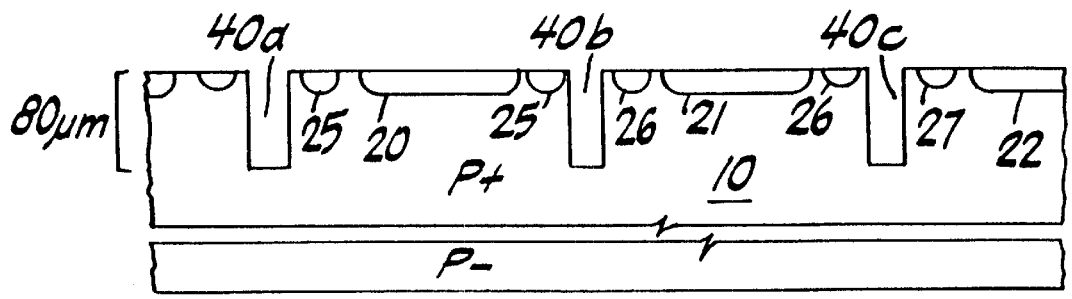
FIG. 3 shows the wafer of FIG. 2 after the formation of isolation trenches which separate and define isolated cells or tubs.

Thereafter, the device is processed to form a grid of deep trench isolations 40 which surround and isolate each of the P+ contact regions and extend into the silicon substrate 10 to a depth of about 80 to 130 microns. Portions of the trench are shown in FIG. 3 in cross-section as portions 40a, 40b and 40c. The trenches create dielectrically isolated tubs or cells in substrate 10. The trenches may be typically formed using known photolithographic patterning and etching steps.

Figure 4:
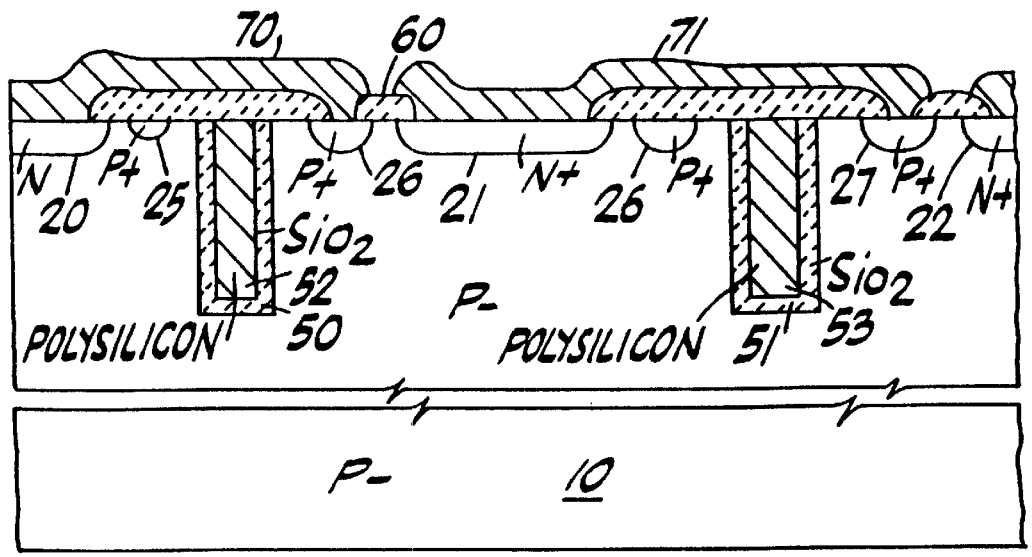
FIG. 4 shows the wafer of FIG. 3 following the formation of an oxide layer on the interior walls of the trenches and a polysilicon region within the trenches to dielectrically isolate the cells, the deposition and patterning of an overlaying oxide layer, and the deposition and patterning of a contact metal layer.

After the trench array 40 is formed, a thin oxide layer or other dielectric layer such as TEOS is thermally grown or deposited on the interior walls of the trench and is shown in FIG. 4 as oxide layers 50 and 51. The trenches are then filled with polysilicon 52. In addition to filling the trench, the polysilicon and dielectric layers are also deposited on the top of the front surface of the wafer and are each removed by respective plasma planarization etch steps. Thus, a plurality of identical dielectrically isolated photovoltaic generator cells is formed in substrate 10. The thickness of the dielectric 50 and 51 is chosen to optimize reflectance of the radiation at the interface with the silicon 10 to improve the efficiency of the device and/or increase the dielectric isolation between cells.

If desired, the diffusion patterns for the cells can be formed at this stage of the process.

After forming the dielectrically isolated tubs or cells, an overlaying oxide layer 60 is deposited atop the front surface of the wafer 10. A photolithographic masking step and an etching step are then used to pattern the oxide to form contact openings to the N+ and P+ regions.

Figure 6:
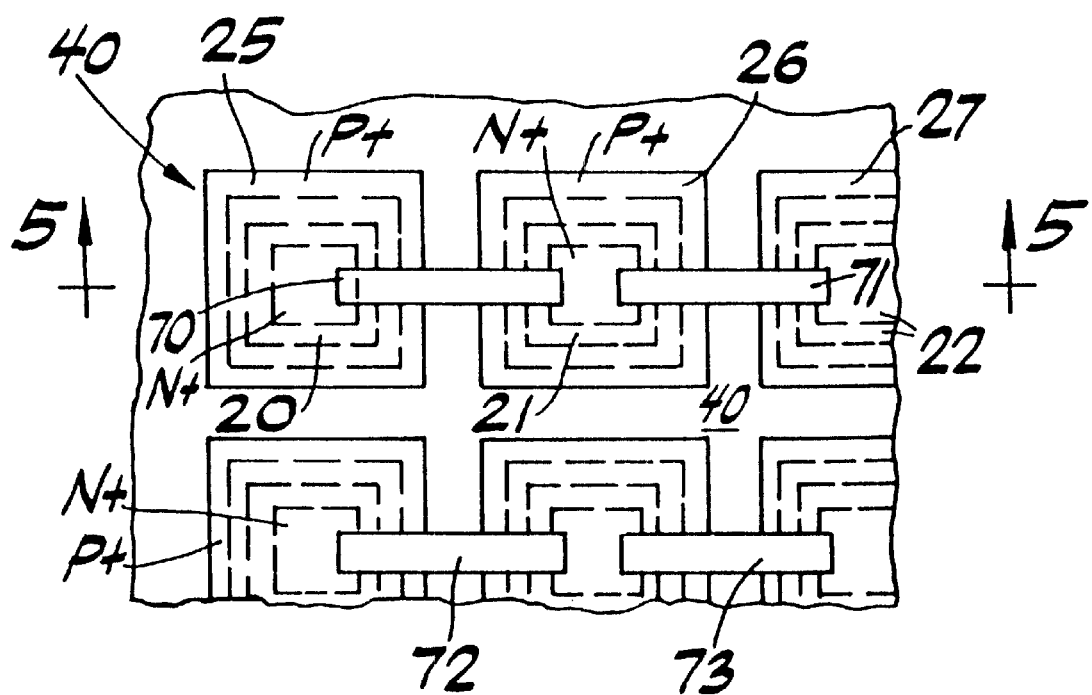
FIG. 6 shows a top view of a portion of the device of FIG. 5 showing the contacts that connect the devices in series.

Thereafter, a contact metal layer is deposited atop the oxide layer 60 and is etched to form contact strips 70, 71, 72 and 73, shown in FIGS. 4 and 6, to connect the N+ diffusion of a cell to the P+ contact diffusion of an adjacent cell.

Figure 5:
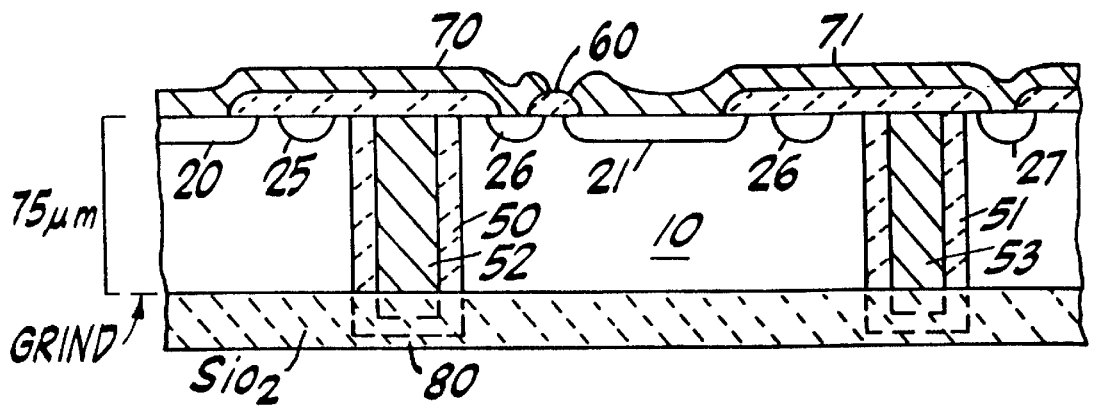
FIG. 5 shows the wafer of FIG. 4 after grinding the back side of the wafer and the formation of an insulating layer on the back side of the wafer.

Then, the wafer may be coated with a protective transparent coating. The back surface of the wafer is then ground away until the bottom of trench 40 is reached. The portion of dielectric layers 50 and 51 that line the bottom of trench 40 may also be removed by polishing about 5 microns of the trench and until the dielectric layers 50 and 51 are exposed on the bottom of the surface of the substrate. Thus, a wafer having a thickness of between 75 to 125 microns thick remains. Thereafter, a passivation layer 80 of silicon dioxide or other dielectric is deposited on the back side of the wafer, as FIG. 5 shows.

The wafer may then be diced into units of a predefined number, typically 16, of series connected cells which have respective solder pad terminals (not shown) to produce devices which can generate a voltage when illuminated by an LED to turn on an MOS-gated power device.

Preferably, the grid of deep trenches 40 are disposed along the 100 and 001 planes for a <100> material. As an example, when <100> oriented starting material is used,. the scribe lines (and trenches) are located in the <110> and <111> planes. Because the wafer is ground very thin by the back surface removal, the trenches can be oriented at a 45° angle to the <110> and <111> planes, thus increasing the mechanical ruggedness of the substrate.

Figure 7:
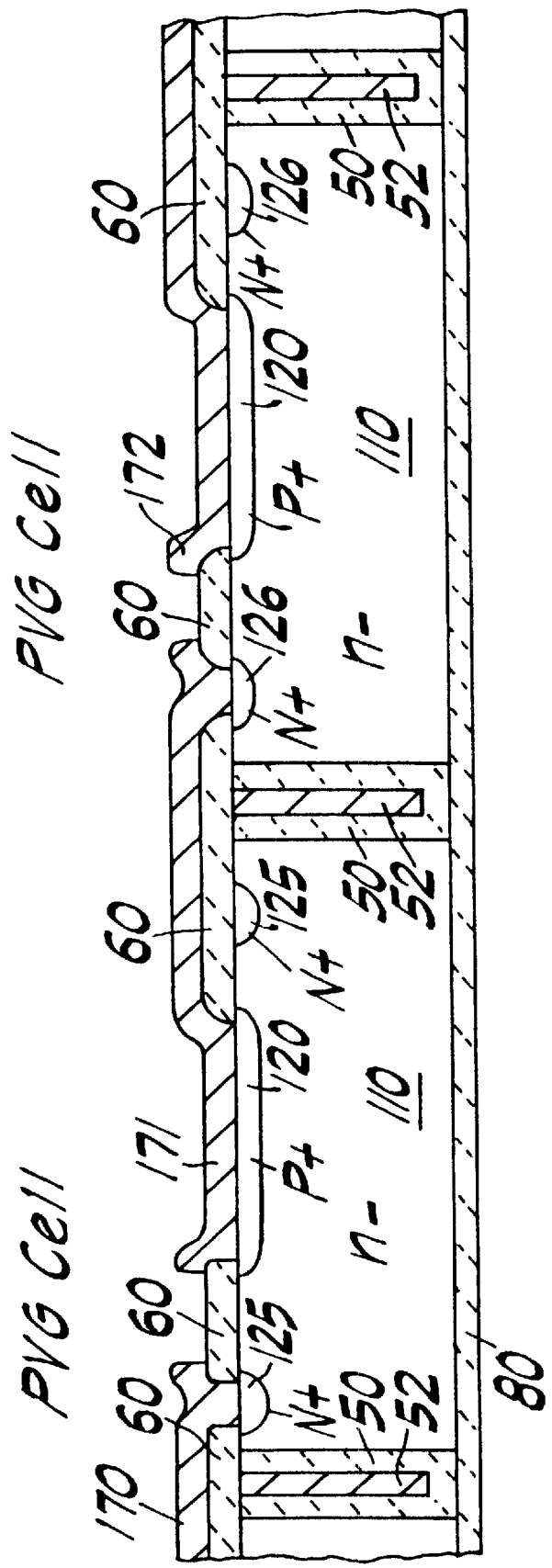
FIG. 7 shows an alternative embodiment of a photovoltaic generator device formed in an N-type substrate according to the invention.

FIG. 7 shows another embodiment of the invention in which an array of rectangular or other shaped shallow P+ diffusion 120 to 122 and substantially square ring shaped N+ contact diffusions 125 to 127 are formed in an N− substrate 110. The P+ diffusions and N+ contact diffusions are first formed in a manner similar to the process shown in FIGS. 1 and 2 except for the substitution of the respective dopants and the corresponding changes in implant dose and energy as well as drive-in time and temperature. The remaining steps of the process are substantially the same as those shown in FIGS. 3 to 6 as shown by the regions having the same reference numerals in both embodiments representing the same structures. The devices are also interconnected in the manner shown in FIGS. 5 and 6.

Advantageously, the devices shown in FIGS. 1 to 6 and FIG. 7 are formed using a simple, relatively inexpensive starting wafer, thus reducing the cost of the device. As a further advantage, the more expensive processing steps, namely the trench formation and the trench filling with dielectric and polysilicon, can be formed towards the end of the process after three of the five lithographic steps have been completed and after formation of the P+ and N+ diffusions. Thus, errors in aligning the photolithographic masks and in doping and driving in the diffusions can be detected prior to relatively more expensive trench formation steps.

Figure 8:
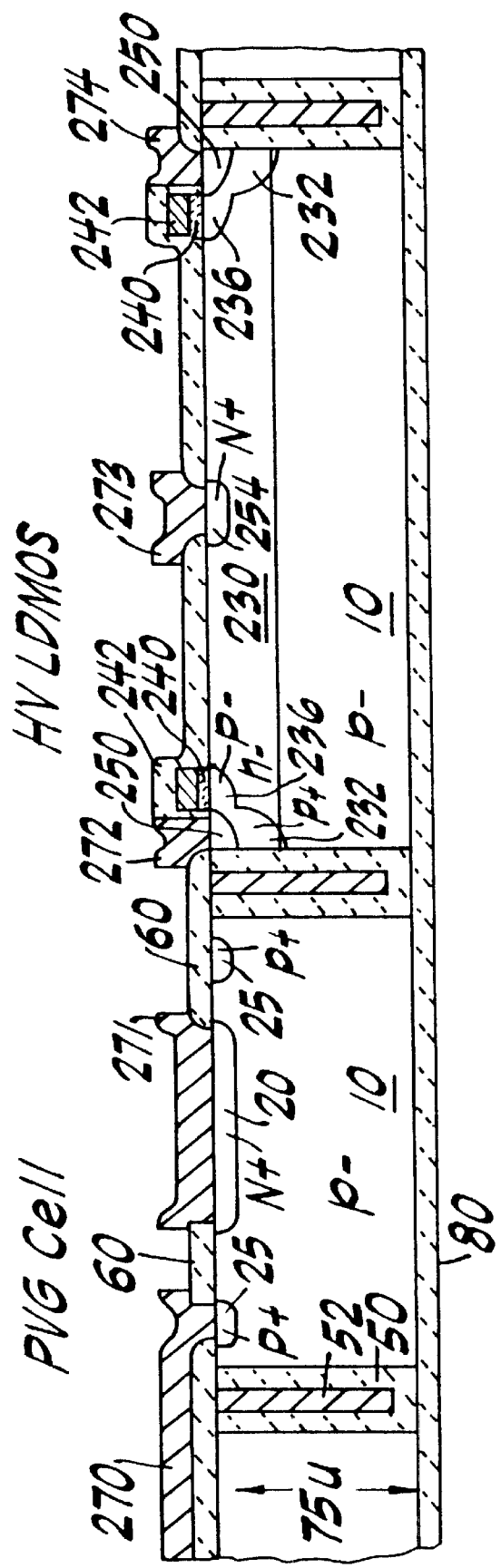
FIG. 8 shows another embodiment of the invention in which a lateral MOSFET is formed in the same substrate as the device of FIG. 5.

FIG. 8 shows another embodiment of the invention in which the photovoltaic generator cells that are formed in the process of FIGS. 1 to 6 are integrated with a lateral high voltage N channel MOSFET in the same P type substrate and are isolated from each other by the same deep trenches that isolate the respective PVG cells. The PVG cells are connected to the gate of the MOSFET to drive the MOSFET.

The MOSFET is preferably formed of ring-shaped polygonal cells, such as square, rectangular or hexagonal cells, though interdigitated structures may be formed. The N channel MOSFET shown in FIG. 8 may be formed by one of a number of known processes for forming a lateral MOSFET. in FIG. 8, for example, a uniform implant of phosphorus is first applied to the bare silicon surface over the active regions of the MOSFET. The phosphorous implant is next driven deep below the top surface of the wafer 10 to form an ultra-deep N type region 230. The initial ultra-deep N$^+$ implant is followed by a very long drive time.

In the next step in the process, an oxide layer is grown atop the surface of the wafer, and a photoresist layer is deposited atop and then appropriately patterned to define windows. The oxide and the underlying thin oxide are then etched through the spaced windows in the photoresist to expose the silicon surface. Thereafter, the photoresist is removed and a heavy boron dose is implanted deep into the exposed silicon surface areas to form the deep central body portions of region 232. Following the implant step, there is typically a short initial drive in of the implant.

Thereafter, oxide segments are grown over the P+ region 232. The P+ regions are initially driven to a short depth to avoid a substantial depletion of the surface boron during the growth of these oxide segments. A photoresist layer is then deposited atop the surface and patterned to define a window pattern by which all oxide except that overlying the P+ region 232 is etched away. The photoresist layer is subsequently removed and a thin gate oxide layer 240 is grown over the fully exposed active area of the wafer.

A polysilicon layer 242 is then deposited atop the wafer and a photoresist layer is deposited atop the polysilicon. The photoresist is then patterned according to another masking step forming openings and is used as a mask to etch the polysilicon, thus forming windows above the gate oxide layer 240. Thereafter, the gate oxide layer is etched which exposes the remaining polysilicon web and the surface of the silicon substrate, and boron is implanted through the diffusion windows. The boron dose here is much lower than that of the heavy boron dose. This boron dose, after diffusion, will merge with the high-dose boron region and will form a low concentration P− type channel region 236 which are shallower than the P+ body portion 232 produced from the higher concentration implants. These regions are then typically driven in to reach a predetermined depth. Thus, lighter doped boron region 236, which are annular regions, are formed though it is clear that where these regions overlap the P+ region 232 they merge with one another.

The P(−) shallow "shelves" 236, which surround deep P+ region 232 are lightly doped channel regions extending beneath the gate oxide.

It will be noted that, in each drive including the P− drive in, all junctions continue to move deeper. The N− region 230 moves to a lesser degree, and P+ region 232 move to a somewhat larger degree. It is also known to those skilled in the art that as the diffusions drive deeper they also move laterally, whereby the shallow diffusion 236 ultimately diffuse under the gate oxide.

The surface is then appropriately de-glassed and arsenic atoms are implanted and are driven in to form the annular N+ source region 250 and annular drain region 254.

Thereafter, an interlayer silicon dioxide or LTO coating 60 is formed over the surface of the chip and is then coated with a photoresist layer which is photolithographically patterned to define a contact mask opening. The surface exposed through the openings in the photoresist is then appropriately etched to expose the underlying inner peripheral portions of the N+ sources 250 and 252 and the N+ drain 254. After removing the photoresist, a subsequently deposited aluminum layer is then photolithographically patterned and etched to form source and drain contacts 272 and 274, respectively, as well as source, drain and gate electrodes (not shown).

An amorphous silicon layer (not shown) may then deposited over the surface of the wafer which is photolithographically patterned and etched to expose appropriate emitter and gate pads. During this operation, the amorphous silicon may be etched with a suitable plasma etch.

Preferably, at least some of the implant steps that form the PVG cell and those that form the MOSFET are performed concurrently to reduce the number of masking steps. It is also preferable that at least some of the drive-ins are performed concurrently. Alternatively, when one of the PVG cell or the MOSFET regions receive an implant, the other one is covered with photoresist or oxide. After the diffusion and drive-in steps, the deposition and patterning of the overlaying oxide layer as well as that of the metal layer are performed for both the PVG cell and the MOSFET at the same time.

It should also be noted that, as a further alternative, the PVG cell can be integrated with a vertical MOSFET in which a further trench is formed at the same time as trench 40 and forms the gate structure of a trench MOSFET. In this embodiment, the thin dielectric layer that is formed on the walls of the trench serves as the gate oxide, and the trenches are filled with doped polysilicon that serves as the gate electrode. The p-shallow shelves are typically omitted and the deep p-type regions are lightly doped to serve as channel regions between the N+ source and drain regions. A further masking step is used on the back surface of the wafer such that the passivating oxide is only formed at the back surface beneath the PVG cells and an additional metal contact is formed at the back surface of the wafer adjacent to the vertical MOSFET.

It should also be noted that a similar device can be formed in an N type substrate in which the PVG cell shown in FIG. 7 is integrated with a P channel MOSFET.

Figure 9:
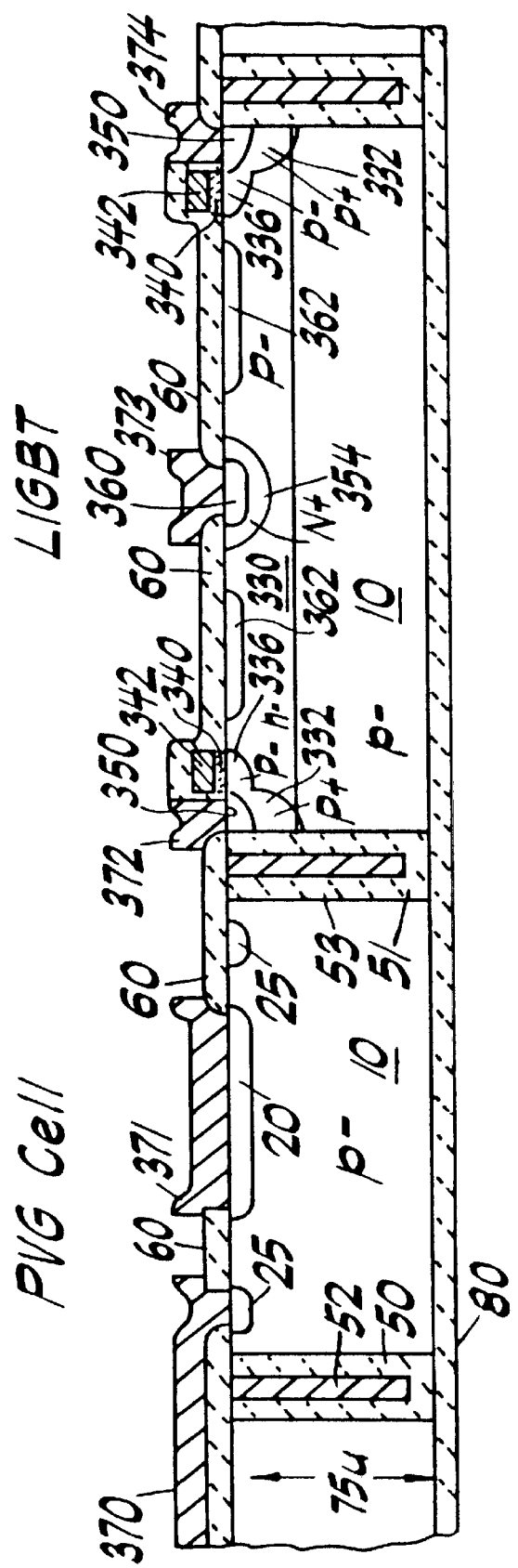
FIG. 9 shows a further embodiment of the invention in which a lateral IGBT is formed in the same substrate as the device of FIG. 5.

FIG. 9 shows a still further embodiment of the invention in which the PVG cells shown in FIGS. 5 and 6 are integrated with and drive a lateral IGBT. In this embodiment, a uniform implant of phosphorus is first applied to the bare silicon surface over the active regions of the IGBT. The phosphorous implant is next driven deep below the top surface of the P− wafer 10 to form an ultra-deep N type "enhancement" region 330. The initial ultra-deep N "enhancement" implant is followed by a very long drive time.

In the next step in the process, an oxide layer is grown atop the surface of the wafer, and a photoresist layer is deposited atop and then appropriately patterned to define windows. Note that this can be done during the trench isolation step. The oxide and the underlying thin oxide are then etched through the spaced windows in the photoresist to expose the silicon surface. Thereafter, the photoresist is removed and a heavy boron dose is implanted deep into the exposed silicon surface areas to form the deep central body portions of regions 332, 334. Following the implant step, there is a typically initial drive of the implant, typically in dry nitrogen plus 1% oxygen, to obtain an initial drive of 1–2 micrometers, for example.

Thereafter, oxide segments are grown over the P+ region 332. The P+ region is initially driven for a short depth to avoid a substantial depletion of the surface boron during the growth of these oxide segments. A photoresist layer is then deposited atop the surface and patterned to define a window pattern by which all oxide except that overlying the P+ region 332 is etched away. The photoresist layer is subsequently removed and a thin gate oxide layer 340 is grown over the fully exposed active area of the wafer.

A polysilicon layer 342 is then deposited atop the wafer and a photoresist layer is deposited atop the polysilicon. The photoresist is then patterned according to another masking step forming openings and is used as a mask to etch the polysilicon, thus forming windows above the gate oxide layer 340. Thereafter, the gate oxide layer is etched which exposes the remaining polysilicon web and the surface of the silicon substrate, and boron is implanted through the diffusion windows. The boron dose here is much lower than that of the heavy boron dose. This boron dose, after diffusion, will merge with the higher-dose boron region and will form a low concentration P− type channel region 336 which surround and are shallower than the P+ body portion 332 produced from the higher concentration implants. These regions are then typically driven in to reach a predetermined depth. Thus, the lighter doped boron regions, which are annular regions, are formed though it is clear that where these regions overlap the P+ region 332 they merge with one another.

The P(−) shallow "shelves" 336 which surround deep P+ region 332 are lightly doped channel regions extending beneath the gate oxide.

It will be noted that, in each drive including the P− drive in, all junctions continue to move deeper. The N region 330 moves to a lesser degree, and P+ regions 332 move to a somewhat larger degree. It is also known to those skilled in the art that as the diffusions drive deeper they also move laterally, whereby the shallow diffusions 336 ultimately diffuse under the gate oxide.

The surface is then appropriately de-glassed and arsenic atoms are implanted and are driven to form the N+ source region 350 and N+ cathode region 354. A P+ collector or anode region 360 is also formed in the N+ cathode region 354.

Thereafter, an interlayer silicon dioxide or LTO coating 60 is formed over the surface of the chip and is then coated with a photoresist layer which is photolithographically patterned to define a contact mask opening. The surface exposed through the openings in the photoresist is then appropriately etched to expose the underlying inner peripheral portions of the N+ sources and cathode and the central body of the P+ regions.

After removing the photoresist, a subsequently deposited aluminum layer is then photolithographically patterned and etched to form emitter and anode contacts 372 and 374, respectively, as well as emitter, anode and gate electrodes (not shown). The aluminum emitter electrode electrically shorts each of the P+ body regions to the inner periphery of their respective annular N+ source regions.

An amorphous silicon layer (not shown) may then deposited over the surface of the wafer which is photolithographically patterned and etched to expose appropriate emitter and gate pads. During this operation, the amorphous silicon may be etched with a suitable plasma etch.

P type resurf region 362 may also be formed in the top surface of the device between the P type body regions and the cathode diffusion.

Alternatively, a vertical IGBT may be integrated with the PVG cells. The collector region is formed at the bottom surface of the wafer and, using appropriate photolithographic steps, a metal contact is formed on the back surface of the IGBT portion of the wafer and the passivating oxide formed on the back surface of the PVG cells.

It should also be noted that one or more MOSFETs or IGBTs can be integrated with the PVG cells of the invention and can be interconnected to form various circuit devices, such as a three-phase bridge, on a single chip.

Moreover, in all of the above devices, a solderable metal layer may be deposited on top of the contact metal layer.

Additionally, any of the above devices can be mounted as a respective chip on a board and may be mounted with an LED insulated therefrom but arranged to produce radiation which illuminates the surface of the wafer or the chip. Any suitable LED can be used.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for fabricating a semiconductor device in a silicon substrate of one conductivity type, said process comprising the steps of:

patterning and etching away selected regions of said top surface of said silicon substrate to form a trench which defines a plurality of cells;

forming a layer of insulation material on the interior walls and bottom surface of said trench;

depositing a layer of polysilicon such that said trench is filled; and removing a portion of a bottom surface of said silicon substrate at least until the bottom surface of said trench is removed.

2. The process of claim 1 which includes the step of introducing impurities of one of said one conductivity type and another conductivity type, which is of opposite conductivity type to said one conductivity type, into selected regions of a top surface of said silicon substrate to form first diffused regions.

3. The process of claim 2 which includes the further steps of:
  depositing an overlaying insulation layer on said top surface;
  patterning and etching away selected portions of said overlaying insulation layer to form at least an opening to one of said first diffused regions in a respective one of said cells and at least another opening to a second diffused region in an adjoining one of said cells;
  depositing a conductive layer;
  patterning and etching away portions of said conductive layer to form at least one interconnecting contact which contacts said first diffused region of said respective cell and said second diffused region of said adjoining cell.

4. The process of claim 2 wherein said one conductivity type is P-type and said another conductivity type is N-type.

5. The process of claim 2 wherein said step of introducing impurities includes the steps of: forming a masking layer atop said top surface of said silicon substrate; patterning and etching away portions of said masking layer; and then implanting said impurities.

6. The process of claim 3 further comprising the step of introducing impurities of another of said one conductivity type and said another conductivity type to form said second diffused regions.

7. The process of claim 1 further comprising the step of planarizing said top surface of said silicon substrate by removing portions of said polysilicon layer and said insulating layer that are formed atop said top surface of said substrate prior to said step of depositing an overlaying insulation layer.

8. The process of claim 1 further comprising the step of coating said top surface of said substrate with a protective coating prior to said step of removing a portion of said bottom surface of said silicon substrate.

9. The process of claim 1 further comprising the step of depositing a passivation layer on said bottom surface of said substrate.

10. The process of claim 9 wherein said passivation layer is comprised of silicon dioxide.

11. A process of fabricating a semiconductor device in a silicon substrate; said process comprising the steps of:
  patterning and etching away selected regions of a top surface of said silicon substrate to form a trench which is spaced from and which encloses a silicon region, thereby forming at least one isolated cell; forming an insulator layer on the walls and bottom surface of said trench and on a portion of the top surface of said substrate that is adjacent to said walls of said trench; depositing a layer of polysilicon on said top surface of said substrate and in said trench such that said trench is filled; and removing a portion of said bottom surface of said silicon substrate to expose said polysilicon from the back surface of said substrate.

12. The process of claim 11 further comprising the step of planarizing said top surface of said silicon substrate by removing portions of said polysilicon layer and by removing a portion of said silicon substrate until said insulating layer that are formed on the trench sidewalls are exposed on the top surface of the silicon substrate prior to depositing an overlaying insulation layer on said top surface.

13. The process of claim 11 further comprising the step of coating said top surface of said substrate with a protective coating prior to said step of removing a portion of said bottom surface of said silicon substrate to expose said polysilicon from the back surface of said substrate.

14. The process of claim 11 further comprising depositing a passivation layer on said bottom surface of said substrate.

15. The process of claim 14 wherein said passivation is comprised of silicon dioxide.

16. The process of claim 11 wherein said trench is formed in a <100> crystal orientation of said substrate and is oriented along a <110>±30 degrees plane of s aid silicon substrate.

17. The process of claim 11 wherein said trench is formed in a <100> crystal orientation of said substrate and is oriented along a <111>±30 degrees plane of the said silicon substrate.

* * * * *